(12) United States Patent
Yazawa et al.

(10) Patent No.: US 7,973,434 B2
(45) Date of Patent: Jul. 5, 2011

(54) POWER SUPPLY SYSTEM EMPLOYING CONDUCTIVE FLUID

(75) Inventors: Kazuaki Yazawa, Chiba (JP); Iwao Takiguchi, Kanagawa (JP)

(73) Assignee: Sony Computer Entertainment Inc., Tokyo (JP)

( * ) Notice: Subject to any disclaimer, the term of this patent is extended or adjusted under 35 U.S.C. 154(b) by 1202 days.

(21) Appl. No.: 11/355,706

(22) Filed: Feb. 16, 2006

(65) Prior Publication Data
US 2006/0185973 A1 Aug. 24, 2006

(30) Foreign Application Priority Data

Feb. 17, 2005 (JP) ................................. 2005-040108

(51) Int. Cl.
*H02K 44/00* (2006.01)
*H01L 23/34* (2006.01)
(52) U.S. Cl. ............ 310/11; 290/43; 257/713; 257/714; 257/E23.098; 361/699
(58) Field of Classification Search ........ 137/1; 310/11, 310/12; 290/43; 257/712, 713, 714, 715, 257/E23.08, E23.097, E23.098; 361/699
See application file for complete search history.

(56) References Cited

U.S. PATENT DOCUMENTS

| | | | | |
|---|---|---|---|---|
| 3,878,410 A | * | 4/1975 | Petrick et al. | 310/11 |
| 4,496,287 A | * | 1/1985 | Nelson et al. | 417/63 |
| 4,767,953 A | * | 8/1988 | Furuya et al. | 310/11 |
| 5,637,934 A | | 6/1997 | Fabris | |
| 5,763,951 A | * | 6/1998 | Hamilton et al. | 257/714 |
| 6,000,912 A | * | 12/1999 | Takada et al. | 417/32 |
| 6,789,611 B1 | * | 9/2004 | Li | 165/104.29 |
| 6,903,929 B2 | * | 6/2005 | Prasher et al. | 361/699 |
| 7,081,684 B2 | * | 7/2006 | Patel et al. | 290/1 R |
| 7,095,143 B2 | * | 8/2006 | Hsu | 310/52 |
| 2003/0098588 A1 | * | 5/2003 | Yazawa et al. | 290/43 |
| 2005/0205241 A1 | * | 9/2005 | Goodson et al. | 165/80.4 |

FOREIGN PATENT DOCUMENTS

| | | |
|---|---|---|
| JP | 2003250262 A | 9/2003 |
| JP | 2004274942 A | 9/2004 |
| JP | 2002050727 A | 2/2008 |

OTHER PUBLICATIONS

Office Action for Japanese Patent Application 2005-040108, dated Aug. 12, 2008.

* cited by examiner

*Primary Examiner* — John Rivell
(74) *Attorney, Agent, or Firm* — Matthew B. Dernier, Esq.; Gibson & Dernier LLP

(57) ABSTRACT

An electromotive cooling head includes a substrate, an N-pole magnet, and an S-pole magnet, and kept in intimate contact with the backside of the semiconductor integrated circuit so as to cover it. The substrate has a fluid channel having a micro-channel structure, through which a conductive fluid flows. An anode and a cathode are disposed to sandwich the fluid channel. The conductive fluid interacts with a magnetic field to thereby induce an electromotive force between the anode and the cathode. A circuit includes, on its backside, a power supply voltage terminal and a ground terminal, and is driven by the electromotive force induced in the electromotive cooling head.

17 Claims, 7 Drawing Sheets

100b

100c ing circuit. The temperature detection unit may detect the temperature of the semiconductor integrated circuit, and the cooling control unit may control the cooling capacity of the cooling device in accordance with the detected temperature.

POWER SUPPLY SYSTEM EMPLOYING CONDUCTIVE FLUID

BACKGROUND OF THE INVENTION

The present invention relates to power supply and cooling technologies, and more particularly to a power supply technology which is applied to semiconductor integrated circuits.

In the design of LSIs, it has become very critical to take the amount of heat generation into account as a performance limit of the chip as semiconductor manufacturers move their manufacturing processes to increasingly finer design rules and achieve significantly larger packing densities. At high temperatures, the chip will malfunction or suffer from degradation in long-term reliability. Accordingly, various measures are taken against heat generation. For example, a heat sink is provided on the upper portion of a chip to liberate the heat generated from the chip.

Recent LSIs, particularly high-performance microprocessors, may generate heat that cannot be dissipated by the heat sink. It is thus an everlasting challenge to improve the efficiency of heat dissipation.

Additionally, there is also a problem that the density of an electric current flowing through a terminal of an LSI connected to a circuit board or the like may have an adverse effect on the reliability of the LSI because the terminal has a limited current capacity. Thus, the power supply to the LSI is also recognized as a critical technical issue.

SUMMARY OF THE INVENTION

The present invention was developed in view of these problems. It is therefore an object of the invention to provide a power supply system which is capable of effectively cooling a semiconductor integrated circuit and supplying power thereto at the same time.

One of the aspects of the present invention relates to a power supply system. The power supply system is adapted to convert the kinetic energy of a cooling medium for cooling an electronic circuit into electric energy, which is in turn used to drive the electronic circuit.

A conductive fluid selected as the cooling medium can be subjected to a magnetic field for the conductive fluid and the magnetic field to interact with each other, thereby causing an electromotive force to be induced according to Faraday's law of electromagnetic induction. The electromotive force can be used to drive the electronic circuit to be cooled.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
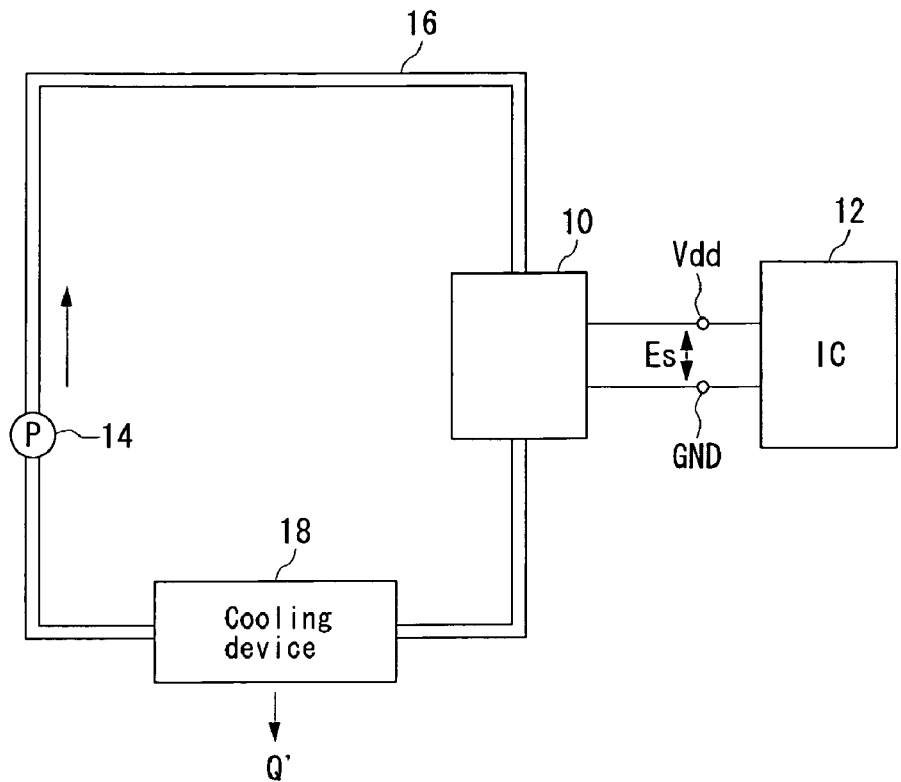
FIG. 1 is a view showing the overall configuration of a power supply system according to an embodiment of the invention.

The invention will now be described based on preferred embodiments which are not intended to limit the scope of the present invention, but rather exemplify the invention. All of the features and the combinations thereof described in the embodiment are not necessarily essential to the invention.

Now, the present invention will be described below first in outline and then in more detail with reference to the accompanying drawings in accordance with the embodiments.

An aspect of the present invention relates to a power supply system. The power supply system includes: a substrate having a fluid channel formed therein; a pump allowing a conductive fluid to flow through the fluid channel formed within the substrate; a magnet which applies a magnetic field perpendicularly to a direction of flow of the conductive fluid; and an anode and a cathode which are respectively provided on two opposing surfaces so as to sandwich the fluid channel in parallel to the direction of application of the magnetic field. The power supply system employs an electromotive force induced between the anode and the cathode to drive a semiconductor integrated circuit.

According to this aspect, the conductive fluid and the magnetic field interact with each other in the fluid channel inside the substrate, thereby causing an electromotive force to be induced between the anode and the cathode according to Faraday's law of electromagnetic induction. The electromotive force can be used to drive the semiconductor integrated circuit.

In the power supply system, the substrate may be secured in close contact with the semiconductor integrated circuit, and the fluid channel may be formed within a region in close proximity to a heat generating portion of the semiconductor integrated circuit. The power supply system may also include a cooling device for cooling the conductive fluid.

The substrate and the semiconductor integrated circuit are thus kept in close contact with each other. This allows heat generated from the semiconductor integrated circuit to be removed by the conductive fluid flowing through the fluid channel, and the conductive fluid to be cooled by the cooling device, thereby providing cooling and supplying power at the same time.

The fluid channel may have a micro-channel structure in which a plurality of micro-channels may be formed adjacent to each other in the direction of application of the magnetic field.

The fluid channel having the micro-channel structure can enhance the heat transport efficiency of the conductive fluid, thereby increasing the cooling efficiency of the semiconductor integrated circuit.

The power supply system may further include a temperature detection unit which detects the temperature of the semiconductor integrated circuit, and a cooling control unit which controls the cooling capacity of the cooling device in accordance with the temperature of the semiconductor integrated circuit detected by the temperature detection unit.

This configuration allows for controlling the cooling device according to the temperature of the semiconductor integrated circuit to adjust the temperature of the conductive fluid, thereby providing cooling with stability.

The anode and the cathode may be connected to a power supply voltage terminal and a fixed voltage terminal of the semiconductor integrated circuit, respectively.

In the power supply system, the anode and the cathode may be provided in parallel to the semiconductor integrated circuit. The anode may be disposed on the semiconductor integrated circuit side of the fluid channel and the cathode may be disposed opposite to the semiconductor integrated circuit side of the fluid channel.

This positional relation between the anode and the cathode allows electrons flowing through the conductive fluid from the cathode to the anode to transport heat as well, thereby making it possible to provide cooling with further enhanced efficiency.

The substrate may be formed of silicon.

Silicon has a high thermal conductivity, and can be easily processed and facilitate formation of electrodes. Thus, selecting silicon as the material of the substrate makes it possible to manufacture a power supply apparatus by utilizing general semiconductor manufacturing processes.

The substrate may also be formed integrally with the semiconductor integrated circuit within a silicon substrate on which the semiconductor integrated circuit is formed.

The substrate being formed integrally with the semiconductor integrated circuit can reduce heat loss at the interface between the semiconductor integrated circuit and the substrate, thereby providing cooling with better efficiency.

The conductive fluid may contain a liquid that has a boiling point in the vicinity of an operating temperature of the semiconductor integrated circuit or its peripheral devices. The power supply system may further include an auxiliary pump which utilizes thermal energy released from the semiconductor integrated circuit or its peripheral devices as energy to vaporize the liquid, thereby converting the thermal energy into the kinetic energy for allowing the conductive fluid to flow through the fluid channel.

Such an auxiliary pump may be employed which utilizes the Rankine cycle (steam cycle) in which the conductive fluid is expanded when passing through the fluid channel within the substrate. This makes it possible to utilize the semiconductor integrated circuit and its peripheral power supply device, etc., as a heat source to drive the conductive fluid.

The electromotive force induced between the anode and the cathode may also be used to drive a load circuit other than the semiconductor integrated circuit.

In place of the semiconductor integrated circuit to be cooled or in conjunction with the semiconductor integrated circuit, other load circuits may be driven using the electromotive force induced between the anode and the cathode.

The power supply system may further include a power source which outputs a drive voltage for driving the semiconductor integrated circuit. Thus, the semiconductor integrated circuit may be driven either by the drive voltage delivered from the power source or the electromotive force induced between the anode and the cathode.

When the electromotive force induced between the anode and the cathode is below a predetermined threshold value, the semiconductor integrated circuit may be driven by the drive voltage delivered from the power source.

If the electromotive force induced between the anode and the cathode is not sufficiently enough to drive the semiconductor integrated circuit, the power source may be alternatively used to drive the semiconductor integrated circuit with stability.

The power supply system may further include a control unit which detects the electromotive force induced between the anode and the cathode and controls a velocity of the conductive fluid so that the electromotive force approaches a predetermined voltage value.

Since the electromotive force induced between the anode and the cathode depends on the velocity of the conductive fluid, it is possible to obtain a stabilized electromotive force by providing feedback control to the velocity based on the electromotive force.

The power supply system may further include a temperature detection unit which detects the temperature of the semiconductor integrated circuit, and a control unit which controls the velocity of the conductive fluid in accordance with the temperature of the semiconductor integrated circuit detected by the temperature detection unit. The control unit may provide control such that the lower the temperature of the semiconductor integrated circuit, the lower the velocity of the conductive fluid becomes.

In this case, when the semiconductor integrated circuit is at a low temperature, the cooling performance can be lowered, thereby reducing the power consumption of the entire system.

Another aspect of the present invention relates to a power supply apparatus. The power supply apparatus includes a substrate having a fluid channel formed therein through which a conductive fluid flows, and an anode and a cathode which are disposed so as to sandwich the fluid channel. The power supply apparatus employs an electromotive force induced between the anode and the cathode by the interaction between the conductive fluid and a magnetic field applied to the conductive fluid to drive the semiconductor integrated circuit to be driven.

According to this aspect, the conductive fluid and the magnetic field interact with each other in the fluid channel inside the substrate, thereby causing an electromotive force to be induced between the anode and the cathode according to Faraday's law of electromagnetic induction. The electromotive force can be used to drive the semiconductor integrated circuit.

The power supply apparatus may further include a magnet which applies a magnetic field to the conductive fluid.

The fluid channel may have a micro-channel structure in which a plurality of micro-channels may be formed adjacent to each other in the direction of application of the magnetic field.

Still another aspect of the present invention relates to a method for driving an electronic circuit. In the method for driving an electronic circuit, kinetic energy of a cooling medium for cooling the electronic circuit is converted into electric energy, which is in turn used to drive the electronic circuit.

According to this aspect, part of the kinetic energy of the cooling medium can be converted into electric energy, thereby providing cooling and supplying power to the electronic circuit at the same time.

Still another aspect of the present invention also relates to a method for driving an electronic circuit. In this method for driving an electronic circuit, the electromotive force induced by the interaction between a conductive fluid for cooling the electronic circuit to be driven and a magnetic field applied to the conductive fluid is used to drive the electronic circuit to be cooled.

According to this aspect, a conductive fluid selected as a cooling medium can be subjected to a magnetic field, thereby allowing the kinetic energy of the conductive fluid to be converted into electric energy to induce an electromotive force according to Faraday's law of electromagnetic induction. The electromotive force can be used to drive the electronic circuit to be cooled.

Still another aspect of the present invention also relates to a method for driving an electronic circuit. In this method for driving an electronic circuit, the electromotive force induced by the interaction between a conductive fluid to be circulated for cooling the electronic circuit to be driven and a magnetic field applied to the conductive fluid is used as an auxiliary power source for making up for a shortage in the power supplied from a main power source that drives the electronic circuit.

According to this aspect, the main power source is prepared in advance, and the aforementioned electromotive force is used as an auxiliary power source, thereby making it possible to provide improved stability to the circuit.

Now, these aspects of the present invention will be described in more detail in accordance with the embodiments.

A power supply system according to an embodiment of the present invention provides cooling to a semiconductor integrated circuit and at the same time supplies drive power to the semiconductor integrated circuit.

FIG. 1 shows the entire configuration of a power supply system 100 according to the embodiment. The power supply system 100 includes an electromotive cooling head 10, a pump 14, a transport pipe 16, and a cooling device 18.

The electromotive cooling head 10 is secured in close contact with a semiconductor integrated circuit 12 so as to absorb a heat quantity Q from the semiconductor integrated circuit 12 as well as to supply an electromotive force Es thereto. As discussed later, the electromotive cooling head 10 includes a substrate in which a fluid channel is formed to allow a cooling medium to flow therethrough, and is connected to the transport pipe 16 at the ends. As discussed later, a conductive fluid is selected as the cooling medium. The electromotive cooling head 10 serves as a power supply apparatus which supplies power to the semiconductor integrated circuit 12.

When activated, the pump 14 causes the cooling medium to circulate through the transport pipe 16 and the fluid channel within the substrate of the electromotive cooling head 10. The cooling medium raised in temperature by the heat quantity Q absorbed in the electromotive cooling head 10 from the semiconductor integrated circuit 12 is cooled down at the cooling device 18. The cooling device 18 may be made up of, e.g., a heat sink, an air cooling fan, a Peltier device, or a combination thereof to absorb a heat quantity Q' from the cooling medium circulating through the transport pipe 16. The pump 14 may be one which mechanically puts the fluid into circulation.

In this manner, the power supply system 100 according to this embodiment allows the cooling medium to circulate through the electromotive cooling head 10 secured to the semiconductor integrated circuit 12, thereby providing cooling to the semiconductor integrated circuit 12.

Figure 2:
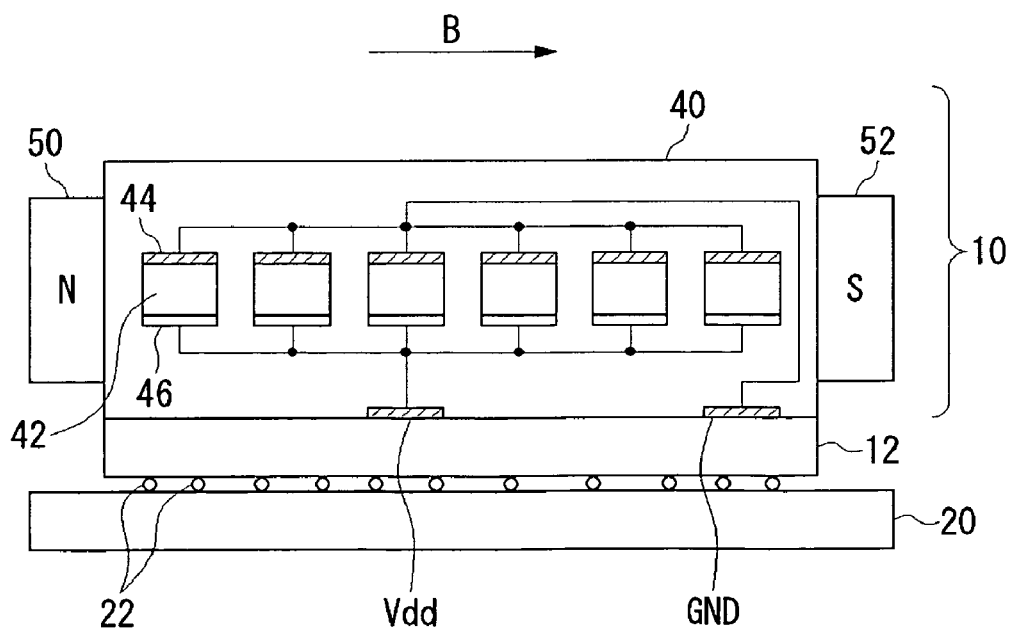
FIG. 2 is a cross-sectional view showing the configuration of an electromotive cooling head which is connected to a semiconductor integrated circuit.

FIG. 2 shows in cross section the electromotive cooling head 10 which is connected to the semiconductor integrated circuit 12.

The semiconductor integrated circuit 12 is a flip chip having a BGA (Ball Grid Array) structure, and connected to a printed circuit board 20 via solder balls 22.

The electromotive cooling head 10 is kept in intimate contact with the semiconductor integrated circuit 12 so as to cover the backside thereof. The semiconductor integrated circuit 12, which has a power supply voltage terminal Vdd and a ground terminal GND on the backside thereof, is driven by the electromotive force Es induced in the electromotive cooling head 10.

Figure 3:
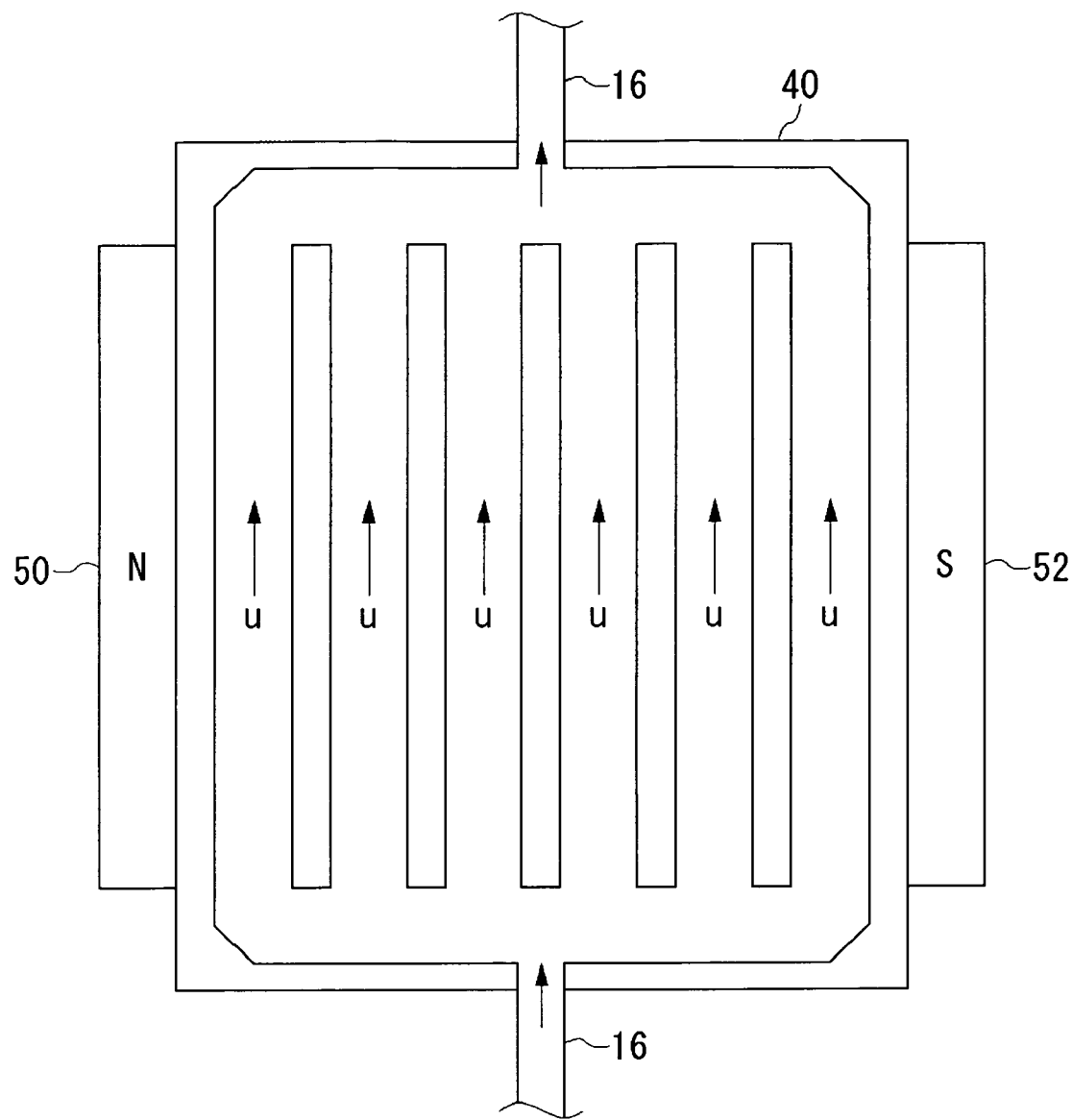
FIG. 3 is a plan view of the electromotive cooling head of FIG. 2 when viewed from above.

The electromotive cooling head 10 includes a substrate 40, an N-pole magnet 50, and an S-pole magnet 52. FIG. 3 is a plan view of the electromotive cooling head 10 when viewed from above.

As shown in FIG. 2, a fluid channel 42 is formed as a plurality of micro-channels within the substrate 40, in which the cooling medium supplied through the transport pipe 16 flows from front to rear in the drawing. The fluid channel 42 is disposed so as to cover the heat generating portion of the semiconductor integrated circuit 12. The cooling medium flows through the fluid channel 42 in the direction as indicated in FIG. 3.

The N-pole magnet 50 and the S-pole magnet 52 are disposed to sandwich the electromotive cooling head 10 to apply a magnetic field perpendicularly to the direction of flow of the cooling medium, i.e., in the direction of formation of the fluid channel. The N-pole magnet 50 and the S-pole magnet 52 establish a magnetic field B from left to right in the drawing. These magnets may be a permanent magnet.

Reference is now made back to FIG. 2. On the inner walls of the plurality of fluid channels 42 formed within the substrate 40, an anode 44 and a cathode 46 are provided on two opposing surfaces to sandwich the fluid channel, respectively, in parallel to the direction of application of the magnetic field B. The anodes 44 each provided on the upper inner wall of the fluid channels 42 are electrically interconnected to each other, and the cathodes 46 each provided on the lower inner wall are also electrically interconnected to each other. The anode 44 and the cathode 46 are connected to the power supply voltage terminal Vdd and the ground terminal GND of the semiconductor integrated circuit 12, respectively.

The substrate 40 is desirably formed of a material having a good thermal conductivity. On the other hand, the terminal of the anode and the cathode provided on the inner wall of the fluid channel 42 formed within the substrate 40 are thus to be formed of a metal material such as copper. Accordingly, when the substrate 40 is formed of semiconductor, especially of silicon, the substrate 40 can be manufactured using silicon semiconductor manufacturing processes. Such steps of fabricating micro-channels and forming electrodes can be performed using a known technique related to MEMS (Micro Electro Mechanical System), and will not be detailed herein.

The substrate 40 and the semiconductor integrated circuit 12 can be conceivably connected to each other in several ways. Suppose that the substrate 40 and the semiconductor integrated circuit 12 are separately manufactured. In this case, as shown in FIG. 2, they may be physically connected to each other by means of solder bumps. Alternatively, the electrodes of the substrate 40 and those of the semiconductor integrated circuit 12 may be subjected to pressure to be brought into contact with each other or wire bonded to each other.

Figure 4:
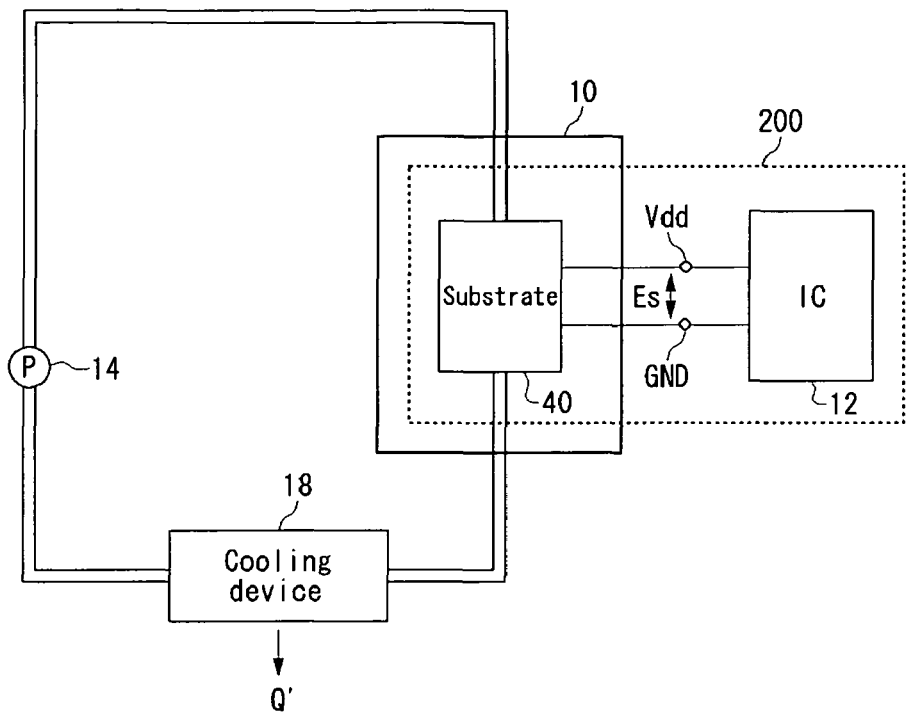
FIG. 4 is a view showing a modified example of the power supply system of FIG. 1.

FIG. 4 is a view showing a modified example of the power supply system of FIG. 1. When silicon is selected as the material to form the substrate 40, the semiconductor integrated circuit 12 and the substrate 40 may be formed integrally on the same silicon chip 200, as shown by the dashed line in FIG. 4. In this case, there exists no interface between the semiconductor integrated circuit 12 and the substrate 40 and thus heat loss is reduced as compared with the case of FIG. 1. It is thus possible to provide cooling with better efficiency.

Now, referring to FIG. 5, a description will be made to the operation of the power supply system 100 configured as described above.

The fluid channel 42 and the transport pipe 16 are filled with a conductive fluid serving as a cooling medium. The conductive fluid may include a metal liquid such as mercury, an indium alloy, a germanium alloy, or a bismuth-based alloy, or NaK. The conductive fluid transports the heat generated from the semiconductor integrated circuit 12 and interacts with a magnetic field to induce an electromotive force as well.

Figure 5:
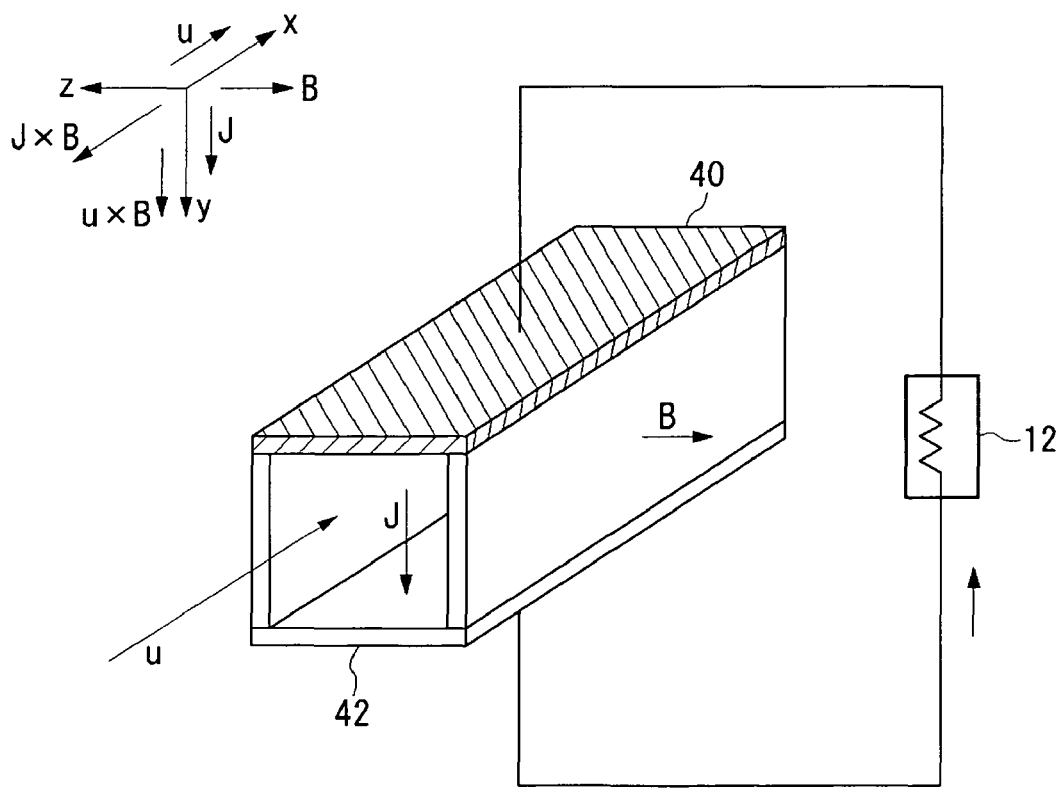
FIG. 5 is a view showing how a conductive fluid in a fluid channel and a magnetic field interact with each other.

FIG. 5 is a view showing how the conductive fluid in the fluid channel 42 and a magnetic field interact with each other.

The conductive fluid flows through the fluid channel 42 at a velocity of "u" in the direction of x-axis. The fluid channel 42 is subjected to a magnetic field of magnetic flux density B, which is established by the N-pole magnet 50 and the S-pole magnet 52 in a direction opposite to the z-axis. As shown in FIG. 5, when the conductive fluid is allowed to flow through the magnetic field, an electromotive force, Es=u×B, is induced perpendicularly to the directions of the velocity "u" of the fluid and the magnetic flux density B in accordance with Faraday's law of electromagnetic induction. This electromotive force Es can be extracted from the anode 44 and the cathode 46 to be supplied as the drive voltage to the semiconductor integrated circuit 12.

In the power supply system 100, the power required to drive the conductive fluid by the pump 14 can be estimated as follows.

The heat quantity Q [W] that can be transported by the conductive fluid flowing through the fluid channel 42 that constitutes the micro-channels is expressed by $$Q = C_p \times g' \times \Delta T = \rho \times C_p \times V' \times \Delta T$$

wherein $C_p$ is the heat capacity of the conductive fluid in [J/kg/K], g' is the mass flow rate in [kg/s], $\rho$ is the density in [kg/m$^3$], V' is the volume flow rate in [m$^3$/s], u is the velocity in [m/s], and $\Delta T$ is the difference in temperature in [K] of the conductive fluid between before and after it passes through the micro-channels. In the equation above, the notation "'" denotes the differentiation of a physical quantity with respect to time. Accordingly, to allow the conductive fluid to transport the heat quantity Qchip generated from the semiconductor integrated circuit 12, required is the volume flow rate V differentiated with respect to time, i.e., V'≧Qchip/($\rho \times C_p \times \Delta T$).

The total cross-sectional area of the conductive fluid is given by N×Ach, where N is the number of the micro-channels and Ach is the cross-sectional area per channel. The velocity "u" of the conductive fluid flowing through the micro-channels is given by u=V'/(N×Ach). The heat quantity generated from the semiconductor integrated circuit 12 can be transported when u≧Qchip/(N×Ach×$\rho \times C_p \times \Delta T$).

Additionally, the flow resistance $\Delta P$ of the micro-channels is given by $\Delta P = \rho \times u^2/2$. Thus, the drive power Wch [W] of the conductive fluid required to allow the conductive fluid to flow through the micro-channels at velocity "u" is Wch=N×Ach×u×$\Delta P$.

On the other hand, the electromotive force Es [V] in the electromotive cooling head 10 is proportional to the magnetic flux B [T] and the velocity "u" of the conductive fluid, and thus given by E=u×B. The internal electric resistance Rint [$\Omega$] of the conductive fluid between the anode 44 and the cathode 46 is Rint=$\sigma \times d/S$, where $\sigma$ is the electric resistivity of the fluid in [$\Omega \cdot m$], d is the distance between the anode 44 and the cathode 46 in [m], and S is the area of the electrodes in [m$^2$]. Accordingly, assuming that the internal resistance of the semiconductor integrated circuit 12 to be powered is Rext [$\Omega$], the current I flowing through the semiconductor integrated circuit 12 is I=Es/(Rin+Rext). Consequently, the power consumption of the semiconductor integrated circuit 12 is Pchip=Es$^2$/(Rint+Rext).

Accordingly, the power Win to be supplied to the conductive fluid by the pump 14 is the sum of the power supplied to the semiconductor integrated circuit 12 as the electromotive force and the power required to allow the conductive fluid to flow through the micro-channels. Thus, considering the efficiency η of the semiconductor integrated circuit 12, it is given that Win≧Wch+η×Pchip=N×Ach×$\rho$/2×u$^3$+η×B$^2$/(Rint+Rext)×u$^2$.

A design example is now shown below in which mercury is employed as the conductive fluid. Suppose that the heat quantity Q is generated from the semiconductor integrated circuit 12 and transported with $\Delta T$=28° C. In this case, the mass flow rate required is 2.13 g/s and the volume flow required is 2.63 cc/s. Assume that the number of fluid channels constituting the micro-channels is 70, and each fluid channel has a cross section of 70 μm×70 μm and a length of 0.8 cm. In this case, the average velocity in each fluid channel required is u=0.94 m/s.

At this time, the flow resistance inside the micro-channels is about 2 MPa. From this, the drive power of the conductive fluid is Wch=4.9 W.

Suppose that a magnetic flux of B=1.1 T is applied to the conductive fluid flowing at a velocity "u" of 0.94 m/s. The electromotive force Es then obtained is Es=1.1 V. Assuming that the electric resistance Rint is 0.1 m$\Omega$ and the internal resistance on the chip side is Rext=1 $\Omega$, it is possible to supply a total power of 70 W to the semiconductor integrated circuit 12.

The conductive fluid flowing at velocity "u" will lose energy due to electromotive induction, thus being subjected to a decelerating force F=JB to be thereby decelerated. Accordingly, the pump 14 for driving the conductive fluid needs to force the conductive fluid into the transport pipe 16 so as to cancel out the decelerating force. That is, the pump 14 needs to supply power Win=Wchip+Wch=74.9 W to the conductive fluid. In practice, in addition to the aforementioned power Win, the power to allow the conductive fluid to flow through the transport pipe 16 is also required.

As described above, the power supply system 100 according to this embodiment allows the electromotive cooling head 10 to absorb heat from the semiconductor integrated circuit 12. At the same time, the power supply system 100 employs a conductive fluid as its cooling medium to allow the electromotive force Es to be induced in the electromotive cooling head 10, thereby supplying power to the semiconductor integrated circuit 12.

Furthermore, the power supply system 100 supplies power via the electrodes Vdd and GND that are provided on the semiconductor integrated circuit 12 side of the electromotive cooling head 10. These electrodes are not subjected to any restriction from other electrodes, and thus can occupy a larger area when compared with the conventional BGA package structure. It is thus made possible to solve the problem of insufficient current capacity per one terminal that was problematic in the conventional BGA package structure.

The power supply system 100 does not need to employ wired conductors, which were conventionally required, to supply power to the semiconductor integrated circuit 12. This configuration makes it possible to eliminate the possibility of a break or a short circuit in the conductor. It is also possible to eliminate a problem such as migrations which were conventionally problematic in supplying power via wired conductors.

Now, based on the power supply system 100, a description will be made to a modified example to which additional technology is provided to allow the circuit to operate with further improved stability and to be cooled with further improved efficiency.

Figure 6:
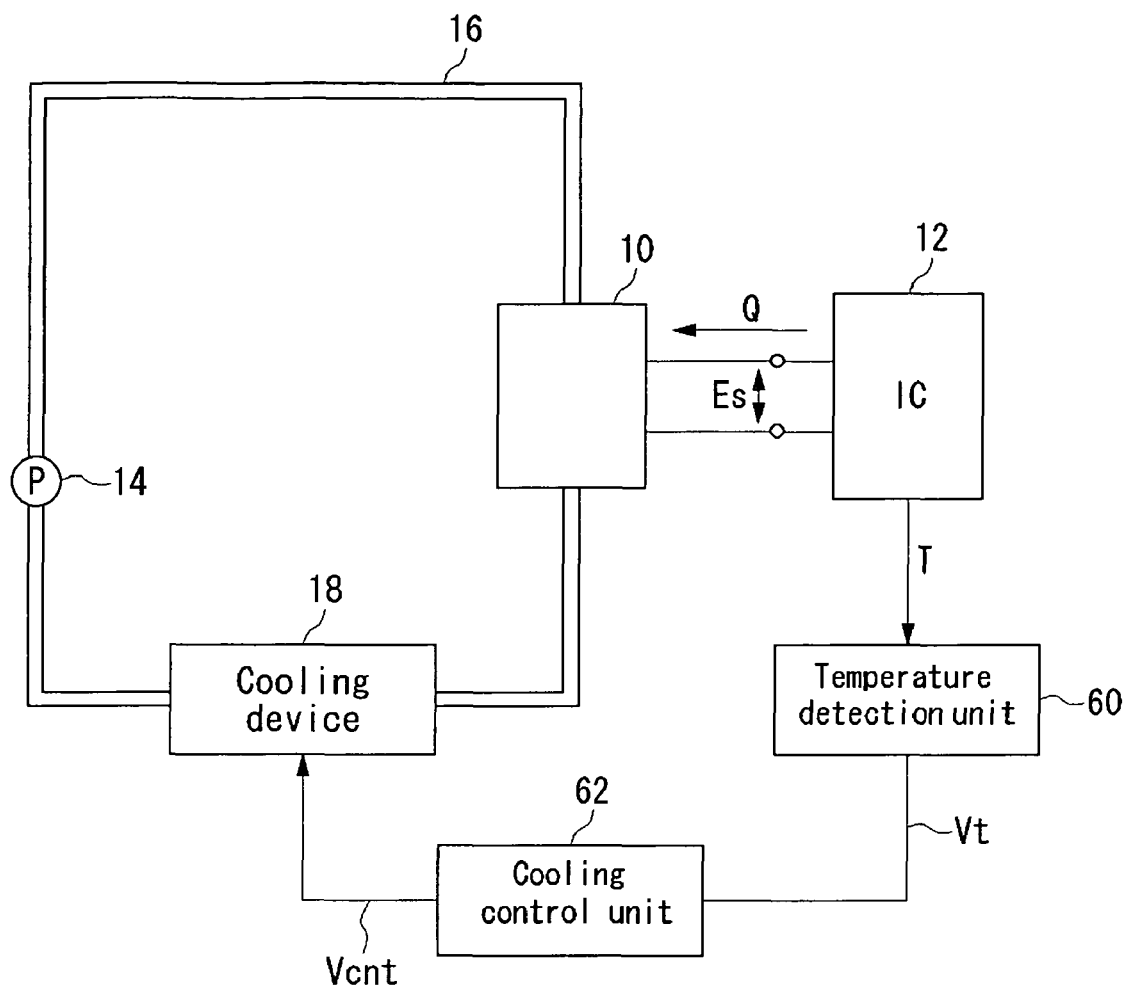
FIG. 6 is a view showing a first modified example of the power supply system.

FIG. 6 is a view showing a first modified example of the power supply system 100 according to this embodiment.

The amount of heat Q generated from the semiconductor integrated circuit 12 will significantly vary depending on the operating condition of the circuit. Accordingly, the capability of the cooling device 18 to cool the conductive fluid may also be controlled while monitoring the temperature T of the semiconductor integrated circuit 12.

FIG. 6 shows an exemplary configuration of a power supply system 100a for controlling the cooling capability of the cooling device 18 according to the temperature of the semiconductor integrated circuit 12. The power supply system 100a includes the electromotive cooling head 10, the pump 14, the transport pipe 16, the cooling device 18, a temperature detection unit 60, and a cooling control unit 62. A description will now be made to a modified example of the power supply system 100 using like reference symbols which denote like components of FIGS. 1 to 3 without repeated explanation of them.

The temperature detection unit 60 detects the temperature T of the semiconductor integrated circuit 12 using a thermocouple, an infrared sensor, or other temperature detection devices. The temperature detection unit 60 outputs a detection signal Vt to the cooling device 18 corresponding to the temperature T of the semiconductor integrated circuit 12.

The cooling control unit 62 produces and outputs a control signal Vcnt for controlling the cooling capability of the cooling device 18 based on the detection signal Vt. The cooling capability of the cooling control unit 62 may be controlled as follows. That is, when the detection signal Vt is above a predetermined threshold value, i.e., when the temperature T of the semiconductor integrated circuit 12 is above a predetermined threshold value, the cooling capability may be increased or feedback controlled so that the temperature T of the semiconductor integrated circuit 12 is kept constant. When the cooling device 18 includes an air cooling fan, the control signal Vcnt may be used to change the rpm of the air cooling fan. On the other hand, when the cooling device 18 includes a Peltier device, the voltage applied to the device can be changed to control the cooling capability.

In this manner, the cooling capability of the cooling device 18 can be controlled according to the temperature T of the semiconductor integrated circuit 12, thereby providing cooling with stability and allowing the semiconductor integrated circuit 12 to operate with stability. When the semiconductor integrated circuit 12 generates a small amount of heat, the drive capability of the cooling device 18 can be lowered, thereby reducing the power consumption of the cooling device 18.

Figure 7:
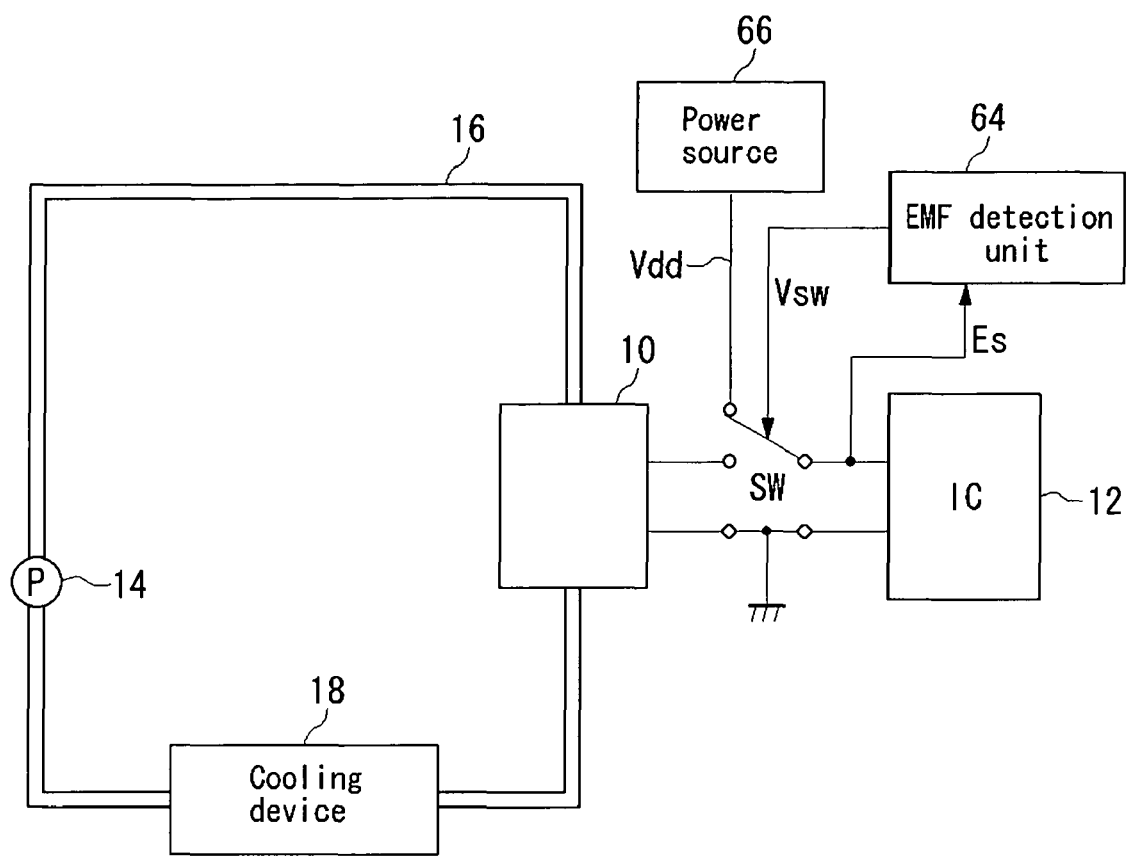
FIG. 7 is a view showing a second modified example of the power supply system.

FIG. 7 shows a second modified example of the power supply system. A power supply system 100b of FIG. 7 includes an electromotive force detection unit 64, a changeover switch SW, and a power source 66. In the power supply system 100b, it may be expected that the electromotive cooling head 10 does not provide a sufficient electromotive force Es as a voltage required to operate the semiconductor integrated circuit 12 with stability. This situation may occur while the velocity "u" of the conductive fluid is approaching the required value, e.g., immediately after the pump 14 has started driving the conductive fluid in the transport pipe 16. To address this situation, the power supply system 100b of FIG. 7 changes the power supply source for the semiconductor integrated circuit 12 to the power source 66 when the electromotive force Es obtained from the electromotive cooling head 10 is below a threshold voltage.

The electromotive force detection unit 64 detects the electromotive force Es obtained from the electromotive cooling head 10 to compare it with a predetermined threshold voltage Vth. The threshold voltage Vth is set to be higher than the voltage required to operate the semiconductor integrated circuit 12 with stability. The electromotive force detection unit 64 outputs a switching signal Vsw to the switch SW.

When Es>Vth, the electromotive force detection unit 64 turns on the switch SW toward the electromotive cooling head 10 side, whereas turning on the switch SW toward the power source 66 side when Es<Vth. A voltage Vdd' delivered from the power source 66 is set to be higher than the threshold voltage Vth.

In the power supply system 100b configured as such, it will never happen that the drive voltage applied to the semiconductor integrated circuit 12 is below the predetermined threshold voltage Vth. Thus, the circuit can be operated with improved stability.

Figure 8:
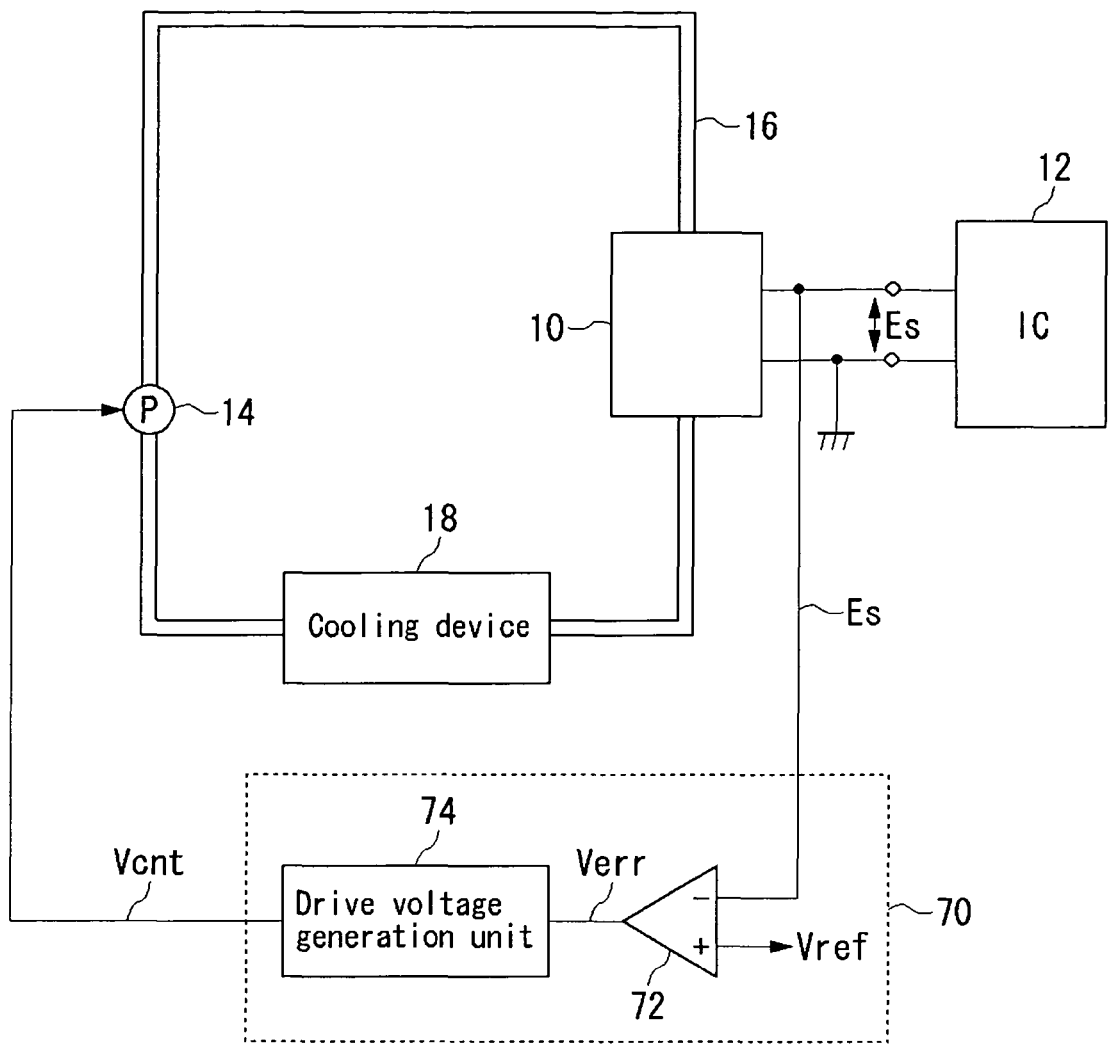
FIG. 8 is a view showing a third modified example of the power supply system.

FIG. 8 shows a third modified example of the power supply system. The power supply system 100c allows the pump 14 to adjust the velocity "u" of the conductive fluid, thereby stabilizing the electromotive force Es in the electromotive cooling head 10.

The power supply system 100c includes a pump control unit 70 in addition to the power supply system 100 of FIG. 1. The pump control unit 70 includes an operational amplifier 72 and a drive voltage generation unit 74.

A reference voltage Vref is supplied to the non-inverting input terminal of the operational amplifier 72, whereas the electromotive force Es supplied to the semiconductor integrated circuit 12 is delivered to the inverting input terminal. An error voltage Verr delivered from the operational amplifier 72 is supplied to the pump 14.

The drive voltage generation unit 74 controls the drive capability of the pump 14 in accordance with the error voltage Verr delivered from the operational amplifier 72. The drive capability of the pump 14 makes it possible to control the velocity "u" of the conductive fluid. The operational amplifier 72 provides feedback control using the error voltage Verr so that two voltages respectively supplied to the inverting input terminal and the non-inverting input terminal are equalized, thereby allowing the velocity "u" of the conductive fluid to be adjusted. Since the electromotive force Es is proportional to the velocity "u" of the conductive fluid, the electromotive force Es can be stabilized such that Es=Vref.

In general, to stabilize the voltage to be supplied to the semiconductor integrated circuit 12, a linear regulator is employed. However, without the need of using the linear regulator, the power supply system 100 detects the electromotive force Es and provides feedback control to the velocity "u" of the conductive fluid. This allows for stabilizing the electromotive force Es at the desired reference voltage Vref and supplying a stabilized voltage to the semiconductor integrated circuit 12.

Figure 9:
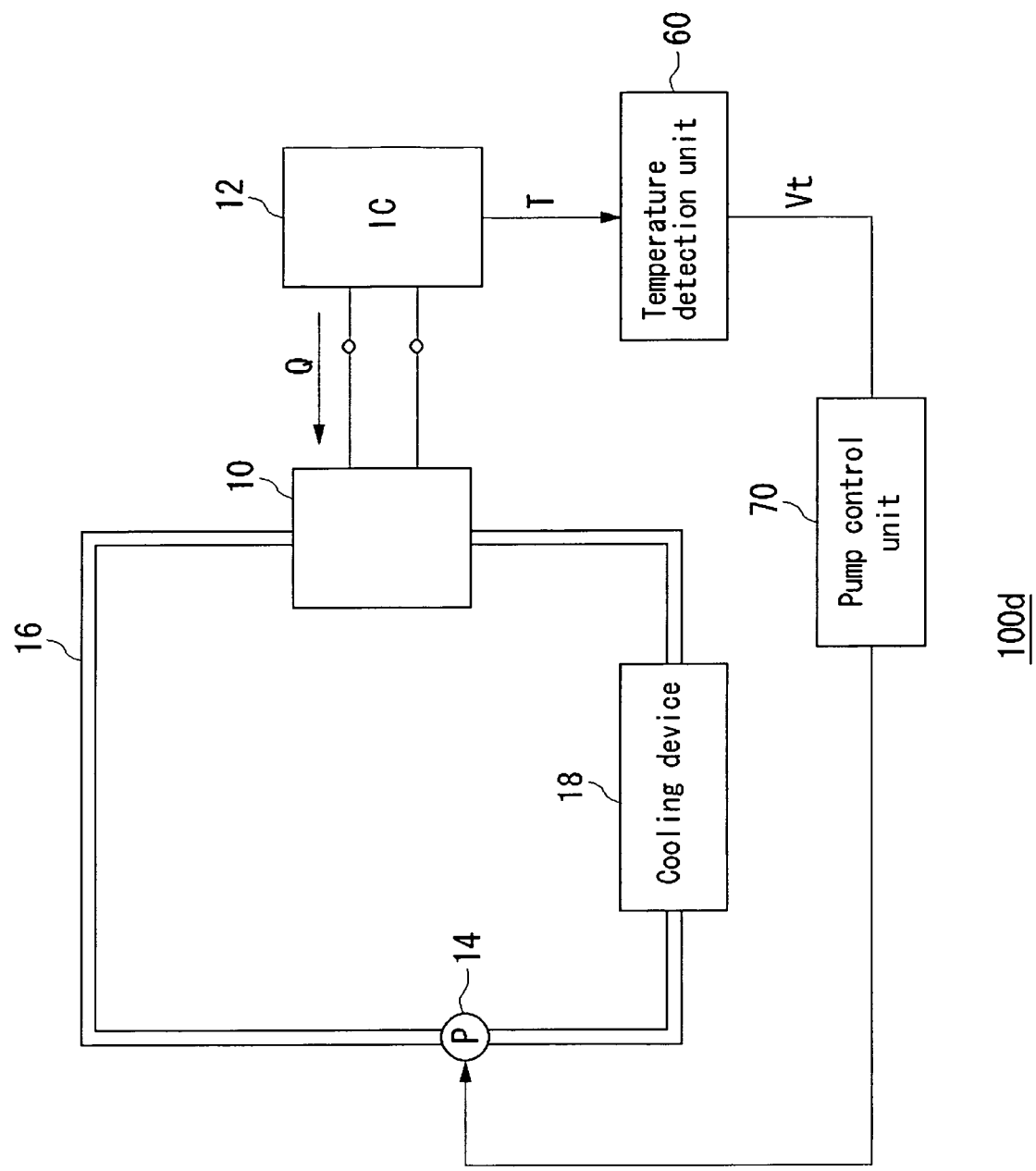
FIG. 9 is a view showing a fourth modified example of the power supply system.

FIG. 9 shows a fourth modified example of the power supply system. Like the power supply system 100c of FIG. 8, a power supply system 100d of FIG. 9 includes the pump control unit 70 for controlling the drive capability of the pump 14. However, the system 100d is different from the system 100c of FIG. 8 in that the drive capability of the pump 14 is controlled in accordance with the temperature T of the semiconductor integrated circuit 12.

In the power supply system 100d, when the temperature detection unit 60 outputs a voltage Vt above a predetermined voltage, i.e., when the semiconductor integrated circuit 12 is at above the predetermined threshold temperature, the pump control unit 70 may raise the level of drive capability of the pump 14 to increase the velocity "u" of the conductive fluid in the electromotive cooling head 10. Alternatively, the pump 14 may also be feedback controlled so that the voltage Vt delivered from the temperature detection unit 60 approaches the predetermined voltage, i.e., the temperature T of the semiconductor integrated circuit 12 approaches a predetermined temperature.

The power supply system configured as such can prevent the temperature T of the semiconductor integrated circuit 12 from increasing beyond the predetermined temperature, thereby preventing thermal runaway of the semiconductor integrated circuit 12 and thus allowing the circuit to operate with stability. Furthermore, the semiconductor integrated circuit 12 may generate only a small amount of heat and thus the semiconductor integrated circuit 12 is at a low temperature T. In this case, the drive capability of the pump 14 can be cut off to reduce the power consumption of the pump 14, thereby allowing for reducing power consumption in the entire system.

In the power supply system 100 and its modified examples, the pump 14 may be one known as a MHD (Magneto Hydro Dynamics) pump. In the power supply system 100 according to the embodiment, a conductive fluid is used as a cooling medium. Thus, a magnetic field may be applied perpendicularly to the direction of flow of the conductive fluid, while an electric field is also applied perpendicularly to the direction of the magnetic field and the direction of the flow, thereby allowing the conductive fluid to be subjected to the Lorentz force and thereby accelerated. The principle of the MHD pump utilizes the property opposite to that of an electric generator shown in FIG. 5. This MHD pump allows the electric field applied to the conductive fluid to accelerate, i.e., to change its velocity, thus making it possible to design a more compact pump as compared to a mechanical pump.

As the cooling medium, the conductive fluid may be mixed with a liquid such as water or FC which is vaporized at a point slightly higher than the room temperature. Furthermore, an auxiliary pump may be installed in the vicinity of the electromotive cooling head 10. The cooling medium absorbs heat from the semiconductor integrated circuit 12 when passing through the fluid channel 42 in the electromotive cooling head 10. The absorption of heat causes the liquid mixed with the cooling medium to vaporize. Since the evaporation of the liquid causes the cooling medium to expand, the auxiliary pump can convert thermal energy to kinetic energy, thereby allowing the conductive fluid to flow through the fluid channel 42. As such an auxiliary pump, it is possible to utilize a heat engine which makes use of the Rankine cycle. Furthermore, the heat source serving as the power source of the auxiliary pump needs not to be limited to the semiconductor integrated circuit 12. It is also possible to use heat generated from a power source of the set in which the semiconductor integrated circuit 12 is mounted.

It will be recognized by those skilled in the art that the aforementioned embodiment and its modified examples have been illustrated only by way of example, and various modifications may be made to each of the components and each combination of the processes without departing from the scope of the present invention.

For example, the techniques employed for the first to fourth modified examples can be arbitrarily combined.

When the techniques used in the first and fourth modified examples are combined, it is possible to provide stabilized operation by employing the temperature detection unit in common. Likewise, when the techniques used in the second and third modified examples are combined, it is possible to employ the electromotive force detection unit 64 in common and thereby supply power to the semiconductor integrated circuit 12 with improved stability.

Furthermore, when the first and third modified examples are combined, it is possible to adjust the cooling capability of the cooling device 18 and control the temperature T of the semiconductor integrated circuit 12, while the velocity "u" of the conductive fluid is adjusted by the pump 14, thereby allowing the electromotive cooling head 10 to generate the electromotive force Es with stability.

While the preferred embodiments of the present invention have been described using specific terms, such description is for illustrative purposes only, and it is to be understood that changes and variations may be made without departing from the spirit or scope of the appended claims.

What is claimed is:

1. A power supply system, comprising:
    a substrate having a fluid channel formed therein;
    a pump allowing a conductive fluid to flow through the fluid channel formed within the substrate and cool an associated semiconductor integrated circuit;
    a magnet which applies a magnetic field to the conductive fluid in a portion of the fluid channel perpendicularly to a direction of flow of the conductive fluid;
    an anode and a cathode which are respectively provided on two opposing inner surfaces of the fluid channel so as to sandwich the portion to which the magnetic field is applied, and in parallel to the direction of application of the magnetic field, wherein the power supply system employs electromotive force induced between the anode and the cathode to drive the semiconductor integrated circuit, and
    the anode and the cathode are provided in parallel to the semiconductor integrated circuit such that the anode is disposed on the semiconductor integrated circuit side of the fluid channel and the cathode is disposed opposite to the semiconductor integrated circuit side of the fluid channel.

2. The power supply system according to claim 1, further comprising a cooling device which cools the conductive fluid, and wherein:
    the substrate is secured in close contact with the semiconductor integrated circuit; and
    the fluid channel is formed within a region in close proximity to a heat generating portion of the semiconductor integrated circuit.

3. The power supply system according to claim 1, wherein the fluid channel has a micro-channel structure in which a plurality of micro-channels are formed adjacent to each other in the direction of the magnetic field.

4. The power supply system according to claim 1, further comprising:
    a temperature detection unit which detects a temperature of the semiconductor integrated circuit; and
    a cooling control unit which controls a cooling capacity of a cooling device in accordance with the temperature of the semiconductor integrated circuit detected by the temperature detection unit.

5. The power supply system according to claim 1, wherein the anode and the cathode are connected to a power supply voltage terminal and a fixed voltage terminal of the semiconductor integrated circuit, respectively.

6. The power supply system according to claim 1, wherein the substrate is formed of silicon.

7. The power supply system according to claim 6, wherein the substrate is formed integrally with the semiconductor integrated circuit within a silicon substrate on which the semiconductor integrated circuit is formed.

8. The power supply system according to claim 1, wherein the conductive fluid contains a liquid that has a boiling point in the vicinity of an operating temperature of the semiconductor integrated circuit or peripheral devices thereof, and the system further comprises an auxiliary pump which utilizes thermal energy released from the semiconductor integrated circuit or the peripheral devices thereof as energy to vaporize the liquid, thereby converting the thermal energy into kinetic energy for allowing the conductive fluid to flow through the fluid channel.

9. The power supply system according to claim 1, wherein the electromotive force induced between the anode and the cathode is used to drive a load circuit other than the semiconductor integrated circuit.

10. The power supply system according to claim 1, further comprising a power source which outputs a drive voltage for driving the semiconductor integrated circuit, so that the semiconductor integrated circuit is driven either by the drive voltage delivered from the power source or the electromotive force induced between the anode and the cathode.

11. The power supply system according to claim 10, wherein when the electromotive force induced between the anode and the cathode is below a predetermined threshold value, the semiconductor integrated circuit is driven by the drive voltage delivered from the power source.

12. The power supply system according to claim 1, further comprising a control unit which detects the electromotive force induced between the anode and the cathode and controls a velocity of the conductive fluid so that the electromotive force approaches a predetermined voltage value.

13. The power supply system according to claim 1, further comprising:
a temperature detection unit which detects a temperature of the semiconductor integrated circuit; and
a control unit which controls a velocity of the conductive fluid in accordance with the temperature of the semiconductor integrated circuit detected by the temperature detection unit, so that the control unit provides control such that the lower the temperature of the semiconductor integrated circuit, the lower the velocity of the conductive fluid becomes.

14. A power supply apparatus comprising:
a substrate having a fluid channel formed therein through which a conductive fluid flows and cools a semiconductor integrated circuit connected therewith; and
an anode and a cathode which are disposed on two opposing inner surfaces of the fluid channel so as to sandwich a portion of the fluid channel to which a magnetic field is applied, wherein the semiconductor integrated circuit is driven by an electromotive force induced between the anode and the cathode by an interaction between the conductive fluid and the magnetic field applied to the conductive fluid wherein the anode and the cathode are provided in parallel to the semiconductor integrated circuit such that the anode is disposed on the semiconductor integrated circuit side of the fluid channel and the cathode is disposed opposite to the semiconductor integrated circuit side of the fluid channel.

15. The power supply apparatus according to claim 14, further comprising a magnet which applies the magnetic field to the conductive fluid.

16. The power supply apparatus according to claim 14, wherein the fluid channel has a micro-channel structure in which a plurality of micro-channels are formed adjacent to each other in a direction of application of the magnetic field.

17. A power supply system, comprising:
means for facilitating fluid flow formed in a substrate;
means for pumping a conductive fluid through the means for facilitating fluid flow formed within the substrate such that an associated semiconductor integrated circuit is cooled by the conductive fluid;
means for applying a magnetic field to the conductive fluid in a portion of the means for facilitating fluid flow, perpendicularly to a direction of flow of the conductive fluid;
means for inducing electromotive force provided on two opposing inner surfaces of the means for facilitating fluid flow so as to sandwich the portion to which the magnetic field is applied, and in parallel to a direction of application of the magnetic field, wherein the power supply system employs electromotive force induced by the means for inducing electromotive force to drive the semiconductor integrated circuit, and
the means for inducing electromotive force is provided in parallel to the semiconductor integrated circuit such that a positive electrode of the means for inducing electromotive force is disposed on the semiconductor integrated circuit side of the means for facilitating fluid flow and a negative electrode of the means for inducing electromotive force is disposed opposite to the semiconductor integrated circuit side of the means for facilitating fluid flow.

* * * * *